US009414166B2

(12) United States Patent
Martin et al.

(10) Patent No.: US 9,414,166 B2
(45) Date of Patent: Aug. 9, 2016

(54) WIRELESS PERIPHERAL HUB DEVICE

(71) Applicant: Hewlett-Packard Development Company, L.P., Houston, TX (US)

(72) Inventors: Randall W. Martin, The Woodlands, TX (US); Matthew Graeme Leck, London (GB); Marcus Andrew Hoggarth, London (GB); John Joseph Briden, San Francisco, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 785 days.

(21) Appl. No.: 13/629,562

(22) Filed: Sep. 27, 2012

(65) Prior Publication Data

US 2014/0086431 A1    Mar. 27, 2014

(51) Int. Cl.
| | |
|---|---|
| *H04B 3/00* | (2006.01) |
| *H04R 5/00* | (2006.01) |
| *H05K 5/03* | (2006.01) |
| *H04R 5/02* | (2006.01) |
| *H05K 5/02* | (2006.01) |
| *H04R 1/02* | (2006.01) |

(52) U.S. Cl.
CPC ............... *H04R 5/02* (2013.01); *H05K 5/0239* (2013.01); *H05K 5/03* (2013.01); *H04R 1/025* (2013.01); *H04R 2201/02* (2013.01); *H04R 2205/021* (2013.01)

(58) Field of Classification Search
CPC ...... H04R 3/12; H04R 2201/02; H04R 1/025; H04R 1/028; H04R 5/02; H04R 5/023; H04R 2201/023; H04R 2205/021; H05K 5/0226; H05K 5/0239; H05K 5/0243; H05K 5/03; H04B 3/00
USPC ................................ 381/77, 80, 87, 332–335
See application file for complete search history.

(56) References Cited

U.S. PATENT DOCUMENTS

| | | | |
|---|---|---|---|
| 5,222,145 A * | 6/1993 | Draffen .................... | H04R 5/02 181/145 |
| 7,149,511 B1 | 12/2006 | Bachner et al. | |
| 7,158,113 B2 * | 1/2007 | Tseng .......................... | 345/156 |
| 8,185,155 B2 | 5/2012 | Chang et al. | |
| 2005/0037787 A1 | 2/2005 | Bachner et al. | |
| 2010/0081473 A1 * | 4/2010 | Chatterjee et al. ............ | 455/559 |
| 2011/0075337 A1 * | 3/2011 | Riley ................. | A47B 21/0073 361/679.2 |
| 2012/0014534 A1 | 1/2012 | Bodley et al. | |
| 2014/0059263 A1 * | 2/2014 | Rosenberg et al. ........... | 710/303 |

FOREIGN PATENT DOCUMENTS

KR   20030045305   6/2003

OTHER PUBLICATIONS

Dirk Husemann at al., "Personal Mobile Hub," Proceedings of the 8th International Symposium on Wearable Computers (ISWC'04), Oct. 31-to-Nov. 3, 2004, pp. 85-91, vol. 1, IEEE.

* cited by examiner

*Primary Examiner* — Davetta W Goins
*Assistant Examiner* — Daniel Sellers
(74) *Attorney, Agent, or Firm* — HP Inc Patent Department

(57) ABSTRACT

Embodiments of the present invention disclose a wireless-enabled peripheral hub device. According to one embodiment, the hub device includes a communication module for wirelessly communicating with one of a plurality of mobile devices and a loudspeaker system configured to stream audio received from one of the mobile devices. Furthermore, the device housing includes a movable cover portion and an internal cavity area for storing an accessory input device for use with one of the plurality of mobile devices.

14 Claims, 5 Drawing Sheets

WIRELESS PERIPHERAL HUB DEVICE

BACKGROUND

The emergence and popularity of mobile computing has made portable electronic devices, due to their compact design and light weight, a staple in today's society. Moreover, mobile devices of various sizes and types continue to proliferate the market place. For example, it is now fairly common to find a user that simultaneously owns a smartphone device, tablet personal computer, and notebook computer. Furthermore, personal data created with these devices typically needs to synchronized with each other and a primary or desktop computer or server (e.g., cloud). However, in addition to having a time-consuming connection and synchronization process for multiple devices, the primary computing system is often located in less-frequented areas of the home (e.g., home office) and thus fails to provide a centralized and convenient access point or a simple means for supplementing the functionality of multiple mobile devices within one household.

BRIEF DESCRIPTION OF THE DRAWINGS

The features and advantages of the inventions as well as additional features and advantages thereof will be more clearly understood hereinafter as a result of a detailed description of particular embodiments of the invention when taken in conjunction with the following drawings in which.

DETAILED DESCRIPTION OF THE INVENTION

Figure 1:
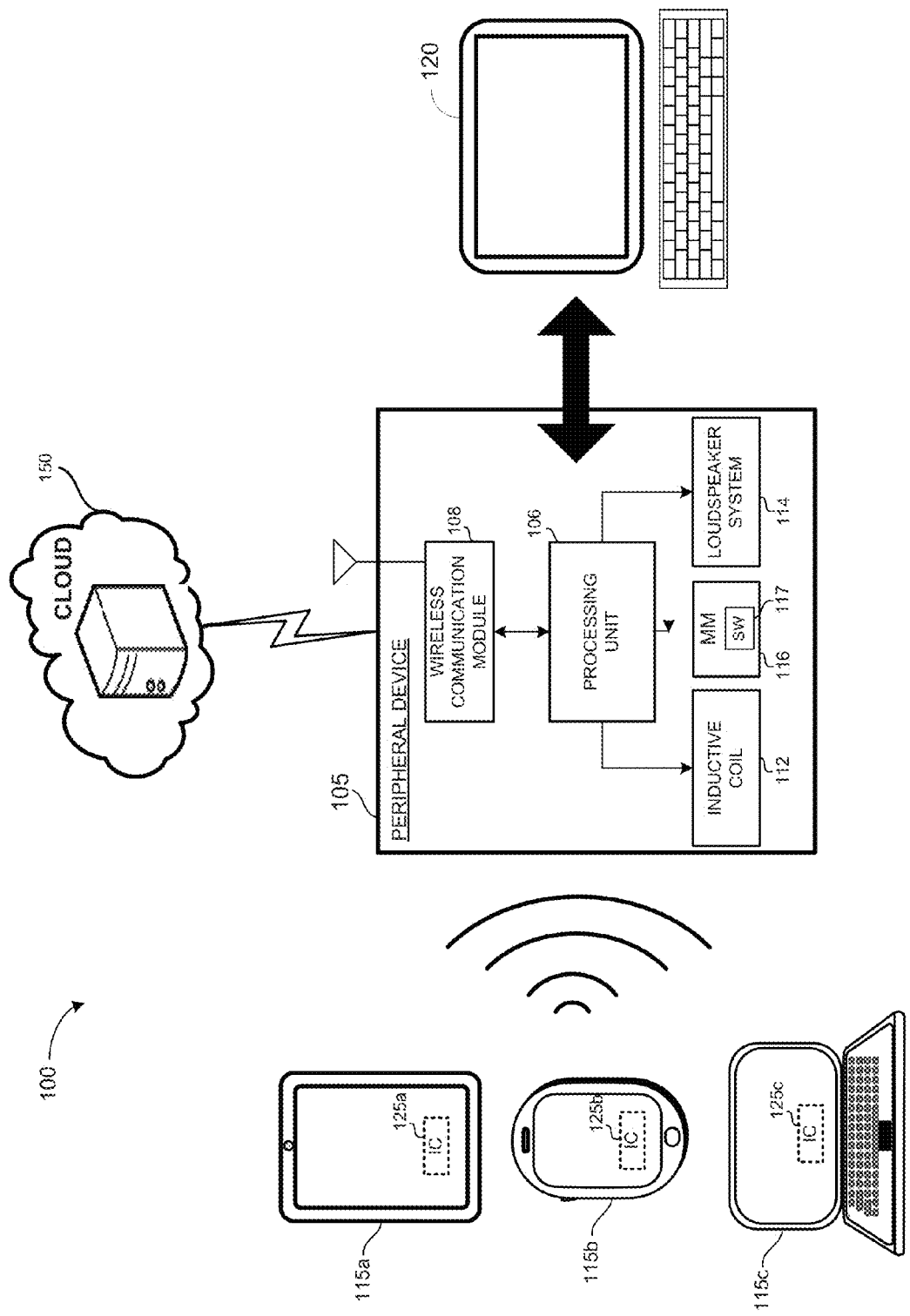
FIG. 1 is a simplified block diagram of the wireless peripheral hub device according to an example of the present invention.

The following discussion is directed to various embodiments. Although one or more of these embodiments may be discussed in detail, the embodiments disclosed should not be interpreted, or otherwise used, as limiting the scope of the disclosure, including the claims. In addition, one skilled in the art will understand that the following description has broad application, and the discussion of any embodiment is meant only to be an example of that embodiment, and not intended to intimate that the scope of the disclosure, including the claims, is limited to that embodiment. Furthermore, as used herein, the designators "A", "B" and "N" particularly with respect to the reference numerals in the drawings, indicate that a number of the particular feature so designated can be included with examples of the present disclosure. The designators can represent the same or different numbers of the particular features.

The figures herein follow a numbering convention in which the first digit or digits correspond to the drawing figure number and the remaining digits identify an element or component in the drawing. Similar elements or components between different figures may be identified by the user of similar digits. For example, 143 may reference element "43" in FIG. 1, and a similar element may be referenced as 243 in FIG. 2. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense.

The prevalence of mobile devices has also led to creation of large amounts of user data including email, contacts, events, calendar items, tasks, photos, videos, applications and the like. Consequently, media hubs and docking stations have been developed to provide a means for backing up and synchronizing data across platforms. However, most media hubs simply behave as back-up servers and fail to enhance the user experience by providing additional functionality for a connected mobile device. Similarly lacking in functionality, docking stations are generally compatible with only one device at a time and also require physical docking of the mobile device for data synchronization or audio playback functionality.

Embodiments of the present invention disclose a wireless peripheral hub device. According to one example, the hub device is configured to facilitate wireless data streaming, charging, and data synchronization across multiple portable electronic devices within proximity of the peripheral device. Still further, the peripheral hub device may include a multimedia speaker and subwoofer for enhanced audio output and storage areas for housing input devices to be used with the mobile devices. Moreover, each portable electronic device may control the peripheral hub device to facilitate data synchronization with a main computing system or cloud server for example.

Referring now in more detail to the drawings in which like numerals identify corresponding parts throughout the views, FIG. 1 is a simplified block diagram of the wireless peripheral hub device according to an example of the present invention. As shown in this example, the system 100 includes a wireless-enabled peripheral hub device 105, a plurality of portable electronic devices 115a-115c, a main computing system 120, and a cloud server 150. Mobile devices may include a tablet computing device 115a, a smartphone device 115b, notebook computer 115c, or similar portable electronic device configured for wireless communication. The main computing system 120 represents a desktop, notebook computer, server or similar device used as the primary computing and/or storage device in the user's household. Moreover, any of the mobile devices 115a-115c can independently or in parallel take control of the peripheral hub device 105 for synchronizing and uploading data and/or media stored on mobile devices 115a-115c onto the main computing device 120 and/or cloud server 150 (e.g., cloud user profile).

The peripheral hub device/base station 105 includes a wireless communication module 106, an inductive coil 112, a loudspeaker system 114, and processing unit 108, which represents a central processing unit (CPU), microcontroller, microprocessor, or logic configured to execute programming instructions associated with the peripheral device 105. Moreover, each of the mobile devices 115a-115c are configured to wirelessly communicate with the peripheral device 105 via the wireless communication module 108, which may represent near field communication, Bluetooth®, wireless-fidelity (Wi-Fi), or similar data exchange protocol for establishing radio communication between two nearby devices. According to one example embodiment, the loudspeaker system 114 includes audio processing functionality (e.g., audio processor, amplifier, coders, etc.) and a subwoofer for streaming digital audio received from one of the mobile devices 115a-115c, the main computing system 120, or cloud server 150.

The inductive coil 112 of the hub device is utilized to provide wireless charging capability to one or more compatible mobile devices 115a-115c via an induction coil 125a-125c associated with the mobile devices 115a-115c for example. The peripheral hub 105 may also include a memory module 116 representing volatile storage (e.g. random access memory), non-volatile store (e.g. hard disk drive, read-only memory, compact disc read only memory, flash storage, etc.), or combinations thereof. Furthermore, memory module 116 may include software 117 that is executable by processing unit 106 and, that when executed, causes the processing unit 106 to perform some or all of the functionality described herein. For example, executable software 117 (which can run on the processing unit) may be configured to automatically synchronize and/or upload data and/or media from a mobile device (e.g., 115a-115c) once the mobile device is within a communicable proximity or range (e.g., 10 meters for Bluetooth protocols, or a foot or less for NFC protocols).

Figure 2:
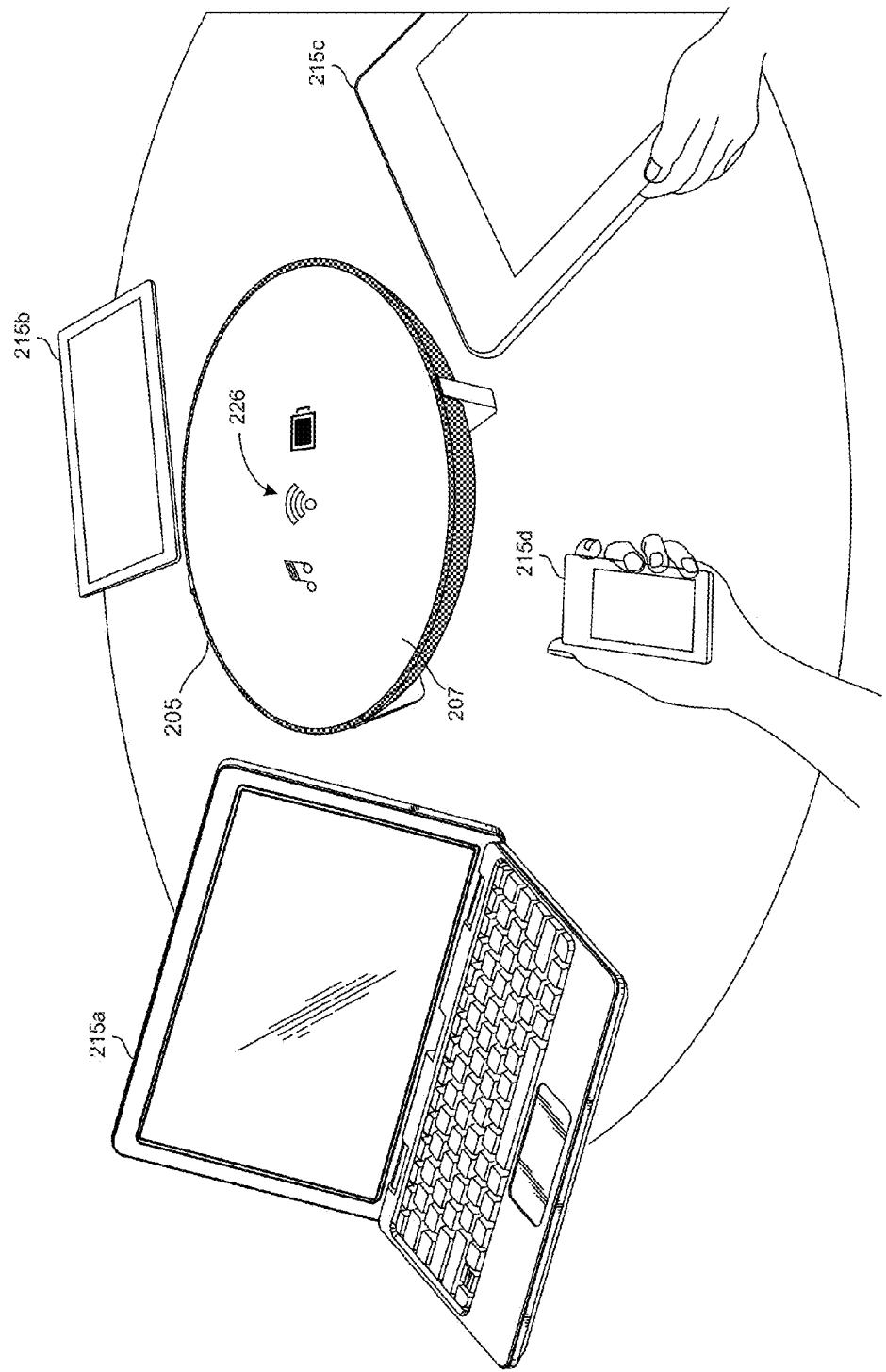
FIG. 2 is an illustration of an operating environment utilizing the wireless peripheral hub device according to an example of the present invention.

FIG. 2 is an illustration of an operating environment utilizing the peripheral hub device according to an example of the present invention. As illustrated here, the wireless-enabled peripheral hub device 205 is set on a tabletop and surrounded by a multitude of portable devices including notebook 215a, tablet computing devices 215b and 215c, and a smartphone device 215d. As explained above, the hub device 205 is configured to provide a connectivity solution for each of the wireless portable devices 215a-215d. According to one example, an upper cover portion 207 of the peripheral hub device 205 may include a notification area 226 for displaying status information of the hub device 205 or one or more connected devices 215a-215d. For example, the notification area 226 may display a status indicator regarding the remaining battery life of the hub device 205 or a connected device 215a-215d, the wireless connection strength, or song/artist info of a currently streaming audio file. In accordance with one embodiment, the processing unit of the peripheral hub device 205 may be configured to automatically sync and upload data with a main computing device or cloud server upon one or more mobile devices 215a-215d coming within a communicable range of the peripheral hub device 205.

Figure 3A:
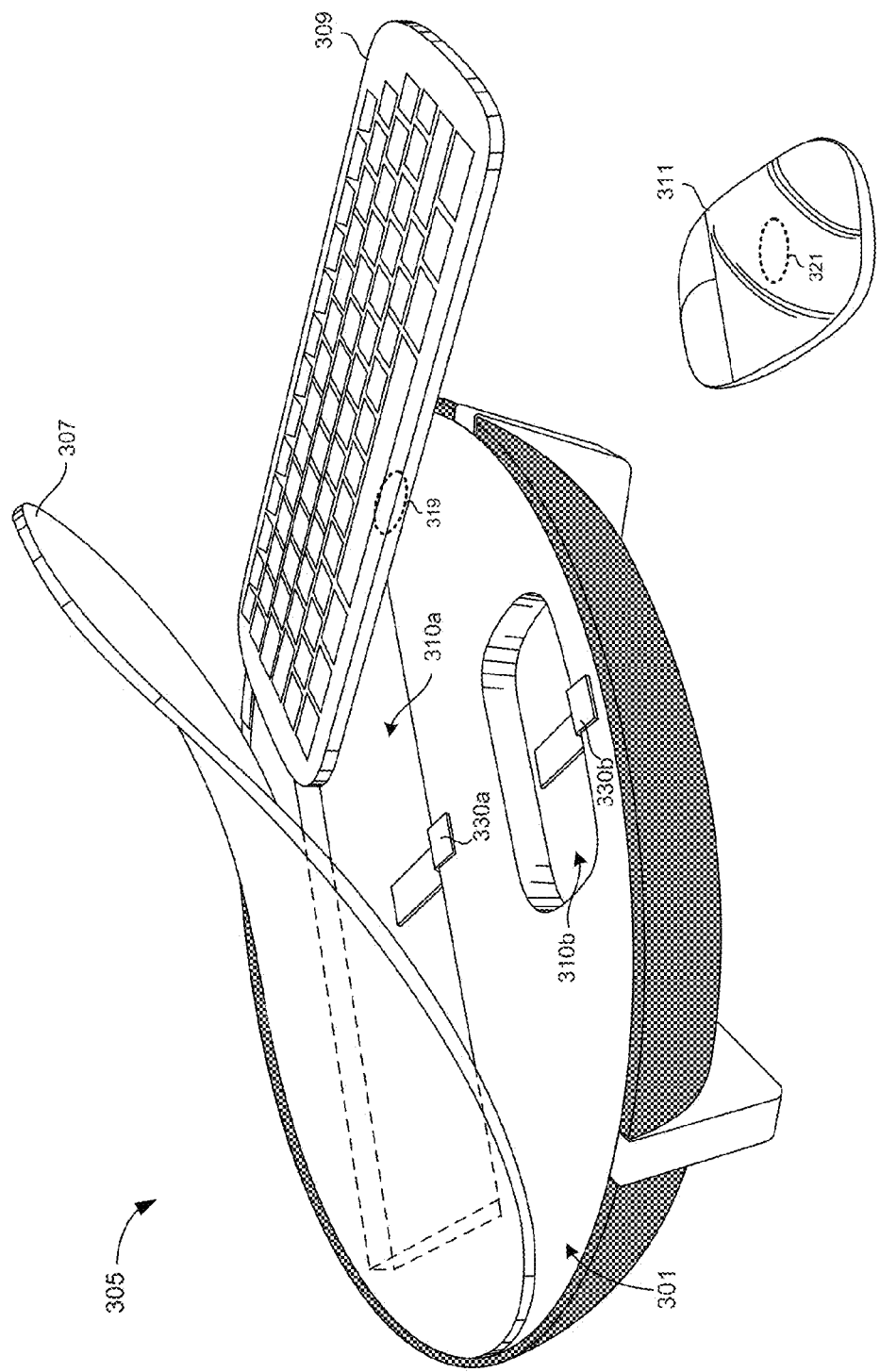
FIGS. 3A and 3B are three-dimensional perspective views of the wireless peripheral hub device including input device storage areas and a movable cover portion according to an example of the present invention.
Figure 3B:
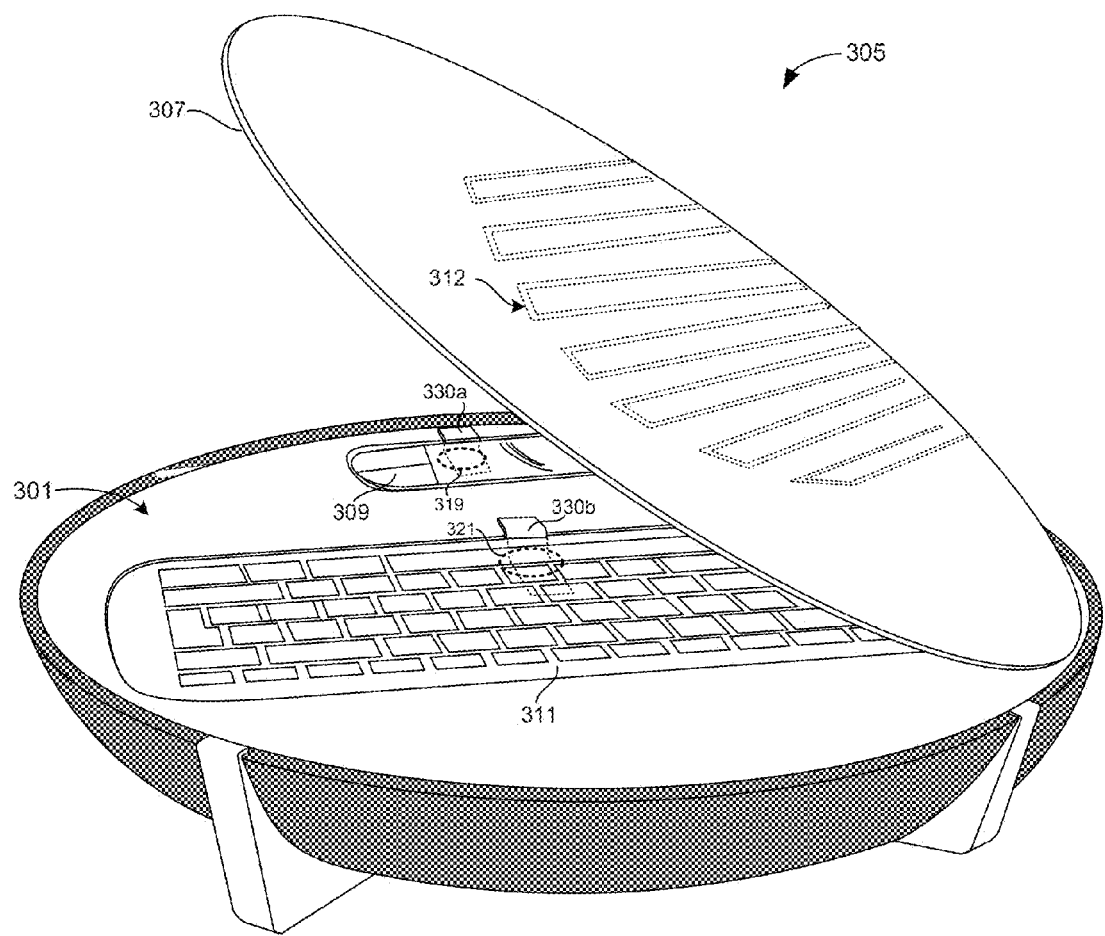

FIGS. 3A and 3B are three-dimensional perspective views of the wireless peripheral hub device including input device storage areas and a movable cover portion according to an example of the present invention. As shown in FIG. 3A, the base station housing 305 further includes cavity areas 310a and 310b configured to stow and charge accessory input devices 309 and 311. According to one example embodiment, the accessory input devices represent a wireless keyboard 309 and wireless mouse 311 respectively, which are capable of being paired and used with one or more portable electronic devices for enhancing input functionality of the paired mobile device. Furthermore. FIGS. 3A and 3B depict the housing 301 of the base station 305 having an upper lid portion 307 that is removable from the rest of housing 301 and also includes wireless power circuitry 308 (e.g., induction coil) formed therein. As shown in FIG. 3B, input devices 309 and 311 may be stowed under the movable lid portion 307 within cavity areas 310a and 310b of the base station housing 301. In one example, cavity areas 310a and 310b include electrical contacts 330a and 330b for facilitating wireless charging between the upper cover portion 307 and wireless input devices 309 and 311. More particularly, when input devices 309 and 311 are in a stored position within cavity areas 310a and 310b of the housing 301 and the upper lid portion 307 is in a covered/closed position over the input devices (i.e., lies parallel with normal surface), wireless circuitry 308 of the upper lid portion 307 engages with electrical contacts 330a and 330b, which serves to wirelessly charge devices 309 and 311 via contacts 319 and 321 for example. In addition, any portable electronic device equipped with a wireless charging feature (i.e., induction coil) may be wirelessly charged by placing the device onto the top surface of the cover lid 307. Accordingly, example embodiments of the present invention enable wireless charging functionality for input devices (e.g., keyboard 309 and 311) and portable electronic devices (e.g., 215a-215d) via both sides of the cover portion 307.

Figure 4:
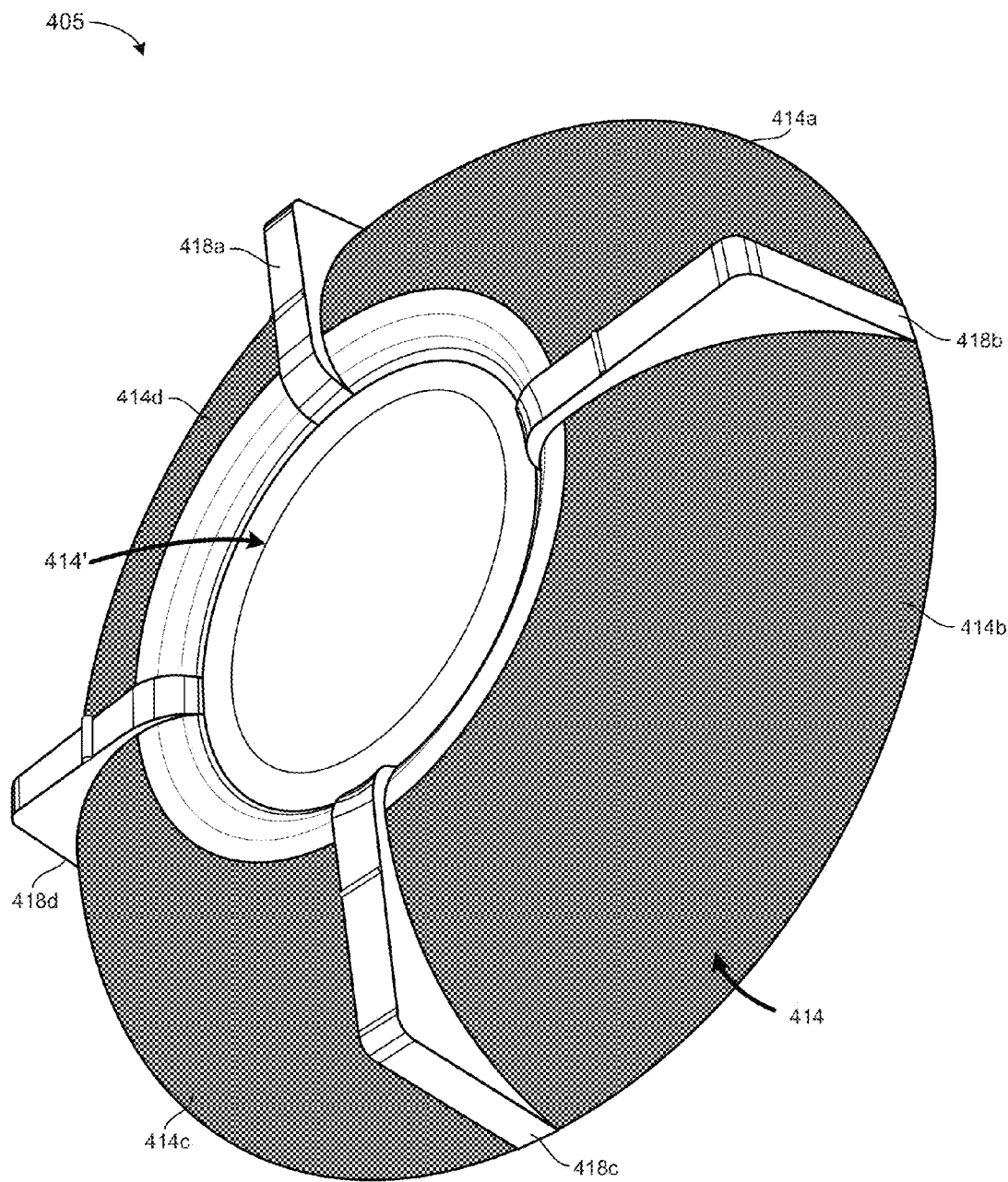
FIG. 4 is a three-dimensional perspective view of an underside area of the wireless peripheral hub device according to an example of the present invention.

FIG. 4 is a three-dimensional perspective view of an underside area of the wireless peripheral hub device according to an example of the present invention. As shown in the present example, side areas of the hub device 405 include a loudspeaker system 414 configured to produce sound in response to audio input from an external source (e.g., mobile device, main computer, etc.). For instance, the loudspeaker system 414 may produce audio via speaker sections 414a-414d and a down-firing subwoofer 414'. In accordance with one example, the subwoofer 414' is positioned on an underside of the base station housing and within the center of the ring-shaped configuration formed by speaker sections 414a-414d. Furthermore, stand portions 417a-417d are positioned between each speaker section 414a-414d to provide a stable support structure and allow for diverse positioning of the peripheral hub device 405 on any surface.

Embodiments of the present invention provide a wireless-enabled peripheral hub device. Moreover, many advantages are afforded by the peripheral device in accordance with examples of the present invention. For instance, the hub device itself is portable and may be conveniently placed in any room of the household for providing centralized access thereto. Furthermore, in addition to providing streaming audio and data synchronization for multiple mobile devices, the hub device of the present examples also provides a large inductive charging surface for simultaneous charging of multiple portable electronic devices positioned adjacent to the cover portion of the housing. Still further, integration of the loudspeaker system and down-firing subwoofer offers an enhanced audio experience, while the internal storage areas provides centralized access to input accessories such as a keyboard and mouse all within an attractive and robust form-factor.

Furthermore, while the invention has been described with respect to exemplary embodiments, one skilled in the art will recognize that numerous modifications are possible. For example, although exemplary embodiments depict particular portable electronic devices, the invention is not limited thereto. For example, the mobile device may be a netbook, cell phone, external display, electronic reading device, or any other mobile device configured for wireless communication. Thus, although the invention has been described with respect to exemplary embodiments, it will be appreciated that the invention is intended to cover all modifications and equivalents within the scope of the following claims.

What is claimed is:
1. A peripheral hub device comprising:
a housing;
a communication module for wirelessly communicating with a plurality of mobile devices;
a processing unit to process wireless communications from the plurality of mobile devices;
a loudspeaker system to stream audio received from the plurality of mobile devices; and an internal cavity area beneath the movable cover, the internal cavity area for storing at least one accessory input device for use with at least one of the plurality of mobile devices;

wherein the loudspeaker system comprises (i) a subwoofer formed on an underside of the housing opposite the movable cover, and (ii) a plurality of speaker areas formed around the underside of the housing and surrounding the subwoofer.

2. The peripheral hub device of claim 1, wherein the processing unit wirelessly synchronizes data stored on a respective one of the plurality of mobile devices with a main computing system.

3. The peripheral hub device of claim 1, wherein when a respective one of the plurality of mobile devices comes within a communicable distance of the peripheral hub device, the processing unit automatically synchronizes and uploads data from the respective mobile device to a cloud server based on a profile associated with an operating user.

4. The peripheral hub device of claim 1, wherein the movable cover includes an induction coil for charging a mobile computing device having corresponding induction coil.

5. The peripheral hub device of claim wherein the inters cavity area includes a plurality of cavities for storing multiple input devices.

6. The peripheral hub device of claim 5, wherein the multiple input devices comprise a wireless keyboard and wireless mouse device.

7. The peripheral hub device of claim wherein at least one of the plurality of cavities includes a connector for at least one of the multiple input devices.

8. The peripheral hub device of claim 1, wherein the communication module is configured to wirelessly communicate with the plurality of mobile devices via at least one of near field communication, Bluetooth, and wireless-fidelity protocol standards.

9. The peripheral hub device of claim 1, wherein the processing unit enables control over the peripheral hub device via operation of any one of the plurality of mobile devices.

10. The peripheral hub device of claim 1, wherein the movable cover includes an electrical contact for charging a respective one of the plurality of mobile devices.

11. The peripheral hub device of claim 1, wherein the cover comprises a notification display for displaying status information for the peripheral hub device.

12. The peripheral hub device of claim 11, wherein the notification displays a status indicator for at least one of battery life of the peripheral hub device.

13. The peripheral hub device of claim 11, wherein the notification display displays battery life for a connected one of the plurality of mobile devices.

14. The peripheral hub device of claim 11, wherein the notification display presents information of a currently streaming audio file of a connected one of the plurality of mobile devices.

* * * * *